United States Patent
Wieczorek et al.

(10) Patent No.: US 6,821,840 B2
(45) Date of Patent: Nov. 23, 2004

(54) SEMICONDUCTOR DEVICE INCLUDING A FIELD EFFECT TRANSISTOR AND A PASSIVE CAPACITOR HAVING REDUCED LEAKAGE CURRENT AND AN IMPROVED CAPACITANCE PER UNIT AREA

(75) Inventors: Karsten Wieczorek, Dresden (DE); Gert Burbach, Dresden (DE); Thomas Feudel, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/403,481

(22) Filed: Mar. 31, 2003

(65) Prior Publication Data

US 2004/0043558 A1 Mar. 4, 2004

(30) Foreign Application Priority Data

Sep. 2, 2002 (DE) .......................................... 102 40 423

(51) Int. Cl.[7] .......................................... H01L 21/8242
(52) U.S. Cl. ........................ 438/240; 438/239; 438/241; 438/981; 438/250; 438/253; 438/396
(58) Field of Search .................... 438/200, 239–241, 438/243–256, 258, 275–276, 279, 381, 396–399, 981; 257/296, 310–311

(56) References Cited

U.S. PATENT DOCUMENTS

| | | | | |
|---|---|---|---|---|
| 4,466,177 A | * | 8/1984 | Chao ........................... | 438/251 |
| 5,482,894 A | | 1/1996 | Havemann ................... | 437/195 |
| 5,502,007 A | | 3/1996 | Murase ........................ | 437/225 |
| 5,580,826 A | | 12/1996 | Matsubara et al. .......... | 437/195 |
| 5,691,252 A | | 11/1997 | Pan ............................. | 437/919 |
| 5,928,960 A | | 7/1999 | Greco et al. ................. | 438/692 |
| 5,960,289 A | * | 9/1999 | Tsui et al. ................... | 438/275 |
| 5,981,369 A | * | 11/1999 | Yoshida et al. ............. | 438/597 |
| 6,057,572 A | | 5/2000 | Ito et al. ...................... | 257/296 |
| 6,064,102 A | | 5/2000 | Gardner et al. ............. | 257/410 |
| 6,074,955 A | | 6/2000 | Lin et al. ..................... | 438/710 |
| 6,093,616 A | | 7/2000 | Liang et al. ................. | 438/396 |
| 6,107,189 A | | 8/2000 | Wald et al. .................. | 438/637 |
| 6,187,672 B1 | | 2/2001 | Zhao et al. .................. | 438/639 |
| 6,251,783 B1 | | 6/2001 | Yew et al. ................... | 438/692 |
| 6,294,460 B1 | | 9/2001 | Subramanian et al. ...... | 438/636 |
| 6,315,637 B1 | | 11/2001 | Apelgren et al. ............. | 451/30 |
| 6,319,824 B1 | | 11/2001 | Lee et al. .................... | 438/639 |
| 6,406,993 B1 | | 6/2002 | Dakshina-Murthy et al. ........................... | 438/624 |
| 6,500,755 B2 | | 12/2002 | Dakshina-Murthy et al. ........................... | 438/637 |
| 6,709,931 B2 | * | 3/2004 | Kim ............................ | 438/275 |
| 2001/0021589 A1 | | 9/2001 | Wilk ........................... | 438/778 |
| 2002/0022334 A1 | | 2/2002 | Yang et al. .................. | 438/396 |
| 2002/0048885 A1 | | 4/2002 | Shibata ....................... | 438/275 |
| 2002/0066916 A1 | | 6/2002 | Hsu et al. .................... | 257/301 |
| 2002/0093781 A1 | | 7/2002 | Bachhofer et al. .......... | 361/312 |
| 2002/0106536 A1 | | 8/2002 | Lee et al. .................... | 428/702 |

FOREIGN PATENT DOCUMENTS

| | | | | |
|---|---|---|---|---|
| EP | 0 764 986 A1 | 3/1997 | ........... | H01L/27/06 |
| JP | 58002071 | 1/1983 | ........... | H01L/29/78 |
| JP | 01222469 | 9/1989 | ........... | H01L/27/04 |

* cited by examiner

*Primary Examiner*—John F. Niebling
*Assistant Examiner*—Jennifer M. Kennedy
(74) *Attorney, Agent, or Firm*—Williams, Morgan & Amerson, P.C.

(57) ABSTRACT

A semiconductor device comprises a field effect transistor and a passive capacitor, wherein the dielectric layer of the capacitor is comprised of a high-k material, whereas the gate insulation layer of the field effect transistor is formed of an ultra thin oxide layer or oxynitride layer so as to provide for superior carrier mobility at the interface between the gate insulation layer and the underlying channel region. Since carrier mobility in the capacitor is not of great importance, the high-k material allows the provision of high capacitance per unit area while featuring a thickness sufficient to effectively reduce leakage current.

10 Claims, 5 Drawing Sheets

US 6,821,840 B2

SEMICONDUCTOR DEVICE INCLUDING A FIELD EFFECT TRANSISTOR AND A PASSIVE CAPACITOR HAVING REDUCED LEAKAGE CURRENT AND AN IMPROVED CAPACITANCE PER UNIT AREA

BACKGROUND OF THE INVENTION

1. Field of the Invention

The present invention generally relates to the field of fabricating integrated circuits, and, more particularly, to the formation of semiconductor devices including field effect transistors, such as MOS transistors, and passive capacitors having a reduced leakage current.

2. Description of the Related Art

In modem integrated circuits, a huge number of individual circuit elements, such as field effect transistors in the form of CMOS, NMOS, PMOS elements, resistors, capacitors, and the like, are formed on a single chip area. Typically, feature sizes of these circuit elements are steadily decreasing with the introduction of every new circuit generation, to provide currently available integrated circuits with an improved degree of performance in terms of speed and power consumption. A reduction in size of transistor is an important aspect in steadily improving device performance of complex integrated circuits, such as CPUs, as the reduction in size commonly brings about an increased switching speed, thereby enhancing signal processing performance and also power consumption, since, due to the reduced switching time period, the transient currents upon switching a CMOS transistor element from logic low to logic high are significantly reduced. On the other hand, the reduction of feature sizes, such as the channel length of the transistor elements in the deep sub-micron regime, entails a plurality of issues that may partially offset the advantages obtained by the improved switching performance. For example, reducing the channel length of field effect transistors requires the reduction of the thickness of the gate insulation layer in order to maintain a sufficiently high capacitive coupling of the gate electrode to the channel region so as to appropriately control the formation of the conductive channel upon application of a control voltage to the gate electrode. For highly sophisticated devices, currently featuring a channel length of 0.18 $\mu$m or even less, typically comprising silicon dioxide for the superior and well known characteristics of the interface between the silicon dioxide and the underlying channel region, a thickness of the gate insulation layer is on the order of 2–5 nm or even less. For a gate dielectric of this order of magnitude, it turns out that, in total, the leakage current passing through the thin gate dielectric may become comparable to the transient currents, since the leakage currents exponentially rise as the gate dielectric thickness is linearly reduced.

In addition to the large number of transistor elements, plural passive capacitors are typically formed in integrated circuits that are used for a plurality of purposes, such as for de-coupling purposes. Since these capacitors are usually formed in and on active semiconductor regions, acting as a first capacitor electrode, with a dielectric layer having characteristics in conformity with process requirements for the concurrently fabricated field effect transistors, and a second capacitor electrode formed of the gate electrode material, the problem of leakage current is significantly exacerbated owing to the large chip area occupied by these capacitor elements. Consequently, the capacitors significantly contribute to the total gate leakage consumption and, therefore, to the total power consumption of the integrated circuit. For applications requiring a minimum power consumption, such as portable battery-powered devices, the high amount of static power consumption may not be acceptable, and, therefore, usually a so-called dual gate oxide processing may be used to increase the thickness of the dielectric layer of the capacitors, thereby reducing the leakage current of these elements.

With reference to FIGS. 1a–1c, a typical prior art process flow for forming capacitors having a reduced leakage current will now be described. FIG. 1a schematically shows a cross-sectional view of a semiconductor device 100 at an initial manufacturing stage. The semiconductor device 100 comprises a substrate 101, for example a silicon substrate, including a first active semiconductor region 120 and a second active semiconductor region 130, which are enclosed by respective isolation structures 102. The second active region 130 and the corresponding isolation structure 102 are covered by a mask layer 103 that may be comprised of photoresist. The first active region 120 comprises a surface portion 104 having severe lattice damage caused by an ion implantation, as indicated by 105.

A typical process flow for forming the semiconductor device as depicted in FIG. 1a includes sophisticated photolithography and etch techniques for defining the isolation structures 102 followed by a further photolithography step to pattern the resist mask 103. As these process techniques are well known in the art, a detailed description thereof is omitted. Subsequently, the ion implantation 105 is carried out with any appropriate ions, such as silicon, argon, xenon and the like, wherein a dose and energy is selected to create severe lattice damage in the portion 104, thereby significantly changing the diffusion behavior of the portion 104 during an oxidation process that is to be carried out subsequently.

FIG. 1b schematically shows the semiconductor structure 100 in an advanced manufacturing stage. A first dielectric layer 121, substantially comprised of silicon dioxide, and having a first thickness 122, is formed on the first active region 120. A second dielectric layer 131 having a second thickness 132 and comprised of the same material as the first dielectric layer 121 is formed on the second active region 130. The first and the second dielectric layers 121 and 131 are formed by conventional oxidation in a high temperature furnace process or by a rapid thermal oxidation process. Due to the severe lattice damage of the surface portion 104, the oxygen diffusion in this surface portion 104 is significantly enhanced compared to silicon portions having a substantially intact crystallinity, such as in the second active region 130. Consequently, oxide growth in and on the first active region 120 is increased compared to the growth rate of the second active region 130 so that the second thickness 132 differs from the first thickness 122 by approximately 0.2–1.0 nm for a thickness of the second dielectric layer 131 on the order of 1–5 nm.

FIG. 1c schematically shows the semiconductor device 100 in a further advanced manufacturing stage, wherein a capacitor 140 is formed in and on the first active region 120, and a field effect transistor 150 is formed in and on the second active region 130. The transistor element 150 comprises a gate electrode 133 including, for example, highly doped polysilicon and a metal silicide portion 135. Moreover, sidewall spacers 134 are formed adjacent to sidewalls of the gate electrode 133. Source and drain regions 136, each including a metal silicide portion 135, are formed in the second active region 130. The capacitor 140 comprises a conductive portion 123 comprised of the same material as the gate electrode 133 and is formed over the first dielectric layer 121. The portion 123 represents one electrode of the capacitor 140. The capacitor electrode 123 includes a metal silicide portion 125 and is enclosed by sidewall spacer elements 124.

A typical process flow for forming the transistor element 150 and the capacitor 140 may include the following steps. A polysilicon layer may be deposited over the device as shown in FIG. 1b and is patterned by well known photolithography and etching techniques to create the capacitor electrode 123 and the gate electrode 133. Subsequently, the drain and source region are formed by ion implantation, intermittently the sidewall spacers 134 and the sidewall spacers 124 are formed so that the sidewal spacers 134 may act as implantation masks to appropriately shape the dopant concentration of the drain and source regions 136. Thereafter, the metal silicide portions 125 and 135 are formed by depositing a refractory metal and initiating a chemical reaction between the metal and the underlying polysilicon of the capacitor electrode 133, and the silicon in the drain and source regions 136.

As is evident from FIG. 1c, the capacitor 140 having the first dielectric layer 121 with the increased thickness 122 will exhibit a significantly reduced leakage current rate compared to the corresponding leakage rate caused by the relatively thin second dielectric layer 131 having the second thickness 132 that is optimized to provide the required dynamic performance of the transistor 150. Although a remarkably improved leakage rate of the capacitor 140 may be obtained with the above-described conventional approach, one decisive drawback is the significantly reduced capacitance per unit area of the capacitor 140 owing to the increased thickness of the first dielectric layer 121. A further disadvantage of the conventional prior art approach is the requirement of a high temperature oxidation process for forming the first and second dielectric layers 121 and 131 so that this process scheme is not compatible with alternative solutions for forming extremely thin gate dielectrics, such as advanced deposition methods for forming ultra thin gate insulation layers. Moreover, the ion bombardment 105 for forming the surface portion 104 (FIG. 1a) may entail a significant oxide degradation and thus may give rise to reliability issues of the first dielectric layer 121, thereby causing premature device failure.

In view of the above-identified problems, there is a need for improved semiconductor devices including transistor elements and passive capacitors, in which leakage current of the capacitors is improved without unduly adversely affecting device characteristics, such as capacitance per unit area, and process compatibility during manufacturing of the device and/or reliability.

SUMMARY OF THE INVENTION

Generally, the present invention is directed to a semiconductor device and a corresponding manufacturing method, wherein a passive capacitor includes a dielectric exhibiting a relatively high permittivity so that the capacitance per unit area may significantly be increased while a thickness of the dielectric may be selected appropriately to ensure a low desired leakage rate. At the same time, the gate insulation layer of field effect transistors may be formed in accordance with process requirements and with a material that ensures the required performance of the transistor device. The present invention is, therefore, based on the inventors' concept that although presently the employment of high-k materials for gate dielectrics in field effect transistors has not been successfully implemented, as these materials cause significant transistor degradation owing to the reduced channel mobility caused by these high-k materials, they may nevertheless be implemented into the same chip area as a capacitor dielectric, since the capacitor performance is not substantially affected by the deteriorated carrier mobility at the interface between the high-k dielectric and the underlying active region.

According to one illustrative embodiment of the present invention, a semiconductor device comprises a first active semiconductor region and a second active semiconductor region separated from each other by a dielectric isolation structure. A capacitor is formed in and over the first active semiconductor region with a first dielectric layer formed on the first active region, wherein the first dielectric layer has a first permittivity. Moreover, a field effect transistor is formed in and on the second active semiconductor region, wherein the field effect transistor includes a gate insulation layer comprising a material having a second permittivity that is less than the first permittivity.

According to yet another illustrative embodiment of the present invention, a semiconductor device comprises a first capacitive element formed in and on a first semiconductor region and a second capacitive element formed in and on a second active region. The first and the second capacitive elements comprise, respectively, a first dielectric layer having a first thickness and a second dielectric layer having a second thickness, and a first conductive layer formed on the first dielectric layer and a second conductive layer formed on the second dielectric layer. Additionally, a capacitance per unit area of the first capacitive element is equal or higher than that of the second capacitive element, wherein the second thickness is less than the first thickness.

According to still another illustrative embodiment of the present invention, a method of forming a semiconductor device comprises providing a substrate having formed thereon a first semiconductor region and a second semiconductor region separated by an isolation structure. Moreover, a first dielectric layer having a first permittivity and a first thickness is formed on the first semiconductor region. Additionally, a second dielectric layer having a second permittivity and a second thickness is formed on the second semiconductor region. Additionally, a conductive material is formed on the first and the second dielectric layers to create a first and a second capacitive element, wherein the first permittivity is higher than the second permittivity.

In accordance with yet a further illustrative embodiment of the present invention, a method of fabricating a semiconductor device including a field effect transistor element and a passive capacitor comprises defining a first active region and a second active region by forming shallow trench isolations. Furthermore, a first dielectric layer is formed on the first semiconductor region as a capacitor dielectric and a second dielectric layer is formed on the second active region as a gate insulation layer of the field effect transistor element. Moreover, a permittivity of the first dielectric layer is higher than that of the second dielectric layer.

BRIEF DESCRIPTION OF THE DRAWINGS

The invention may be understood by reference to the following description taken in conjunction with the accompanying drawings, in which like reference numerals identify like elements, and in which.

Figure 1A:
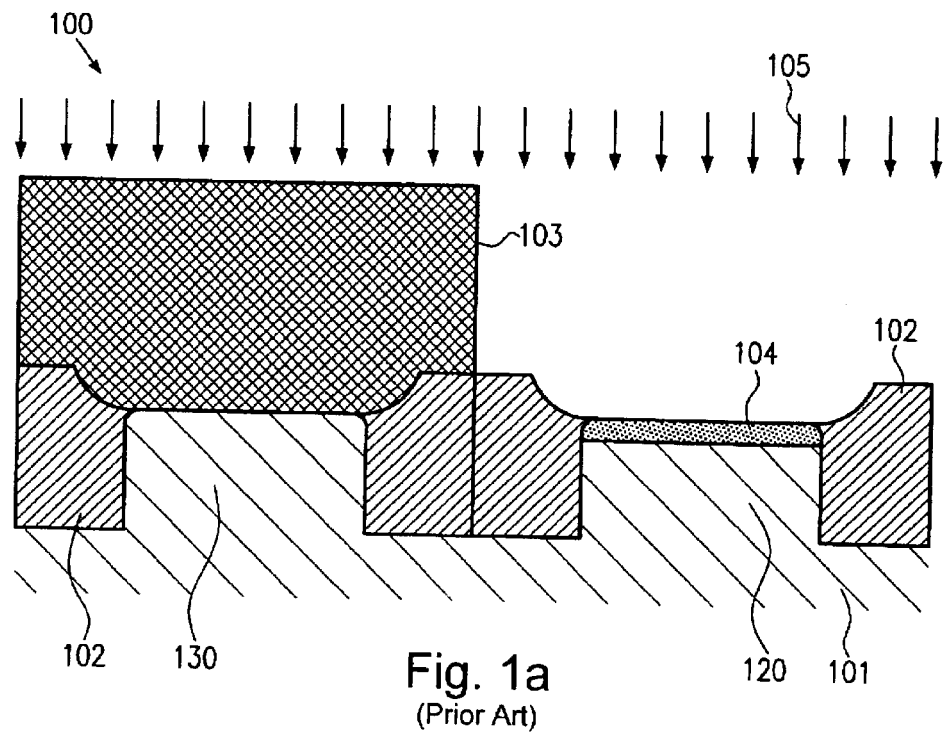
FIGS. 1a–1c schematically show cross-sectional views of a semiconductor device including a passive capacitor and a transistor element that are fabricated in accordance with a typical prior art process flow.
Figure 1B:
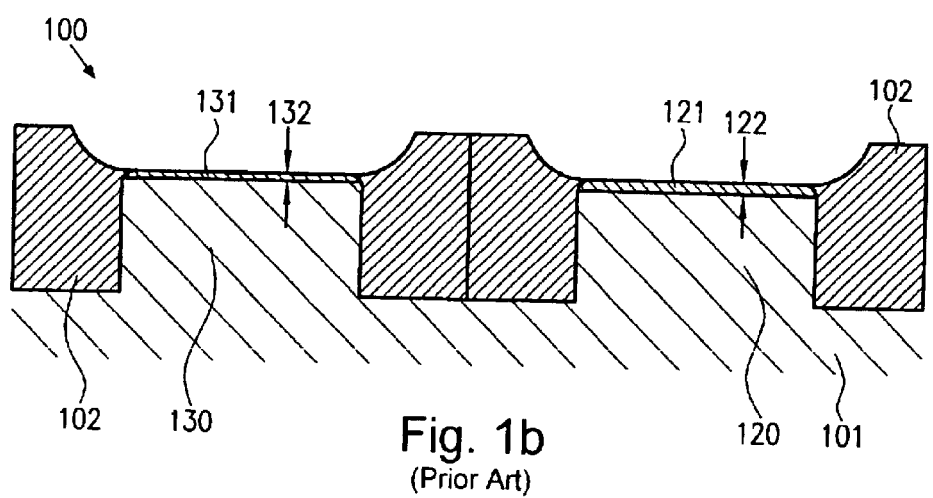

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
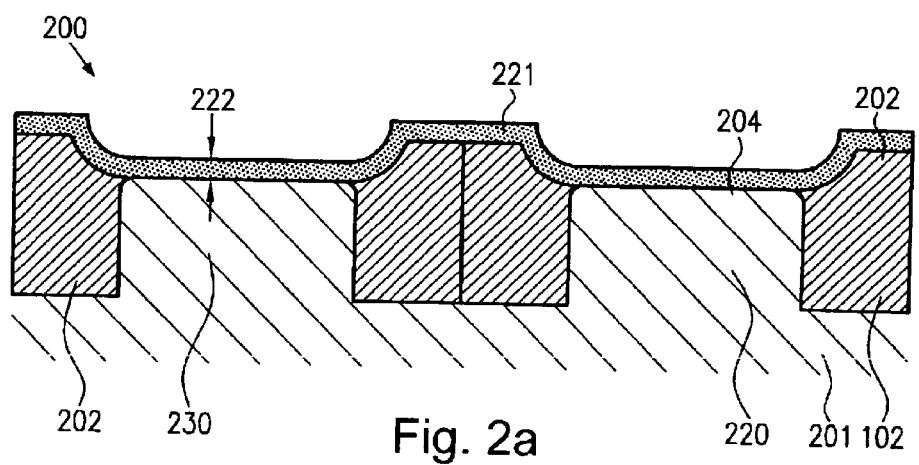
FIGS. 2a–2g schematically show cross-sectional views of a semiconductor device including a low leakage capacitor having an increased capacitance per unit area, which is formed in accordance with one illustrative embodiment of the present invention.

With reference to FIGS. 2a–2g, illustrative embodiments of the present invention will now be described in more detail. In FIG. 2a, a semiconductor device 200 comprises a substrate 201, which may be any appropriate substrate, such as a silicon substrate, a glass substrate, a sapphire substrate, an SOI (silicon on insulator) substrate and the like. Irrespective of the specific type used, the substrate 201 comprises a first semiconductor region 220 and a second semiconductor region 230 that are substantially isolated from each other by an isolation structure 202, such as a shallow trench isolation as is usually used in highly sophisticated circuits. On top of the semiconductor device 200, a first dielectric layer 221 is formed having a first thickness 222. The first dielectric layer 221 may be formed of a material exhibiting a high permittivity represented by a high dielectric constant k. Materials that may be suitably employed in the first dielectric layer 221 include, without limiting the present invention to these materials, zirconium oxide and/or zirconium silicate and/or hafnium oxide and/or hafnium silicate. Compared to the commonly-employed silicon dioxide, possibly including a certain amount of nitrogen, the k value may be at least twice as high or even more for these materials. The exact value of the permittivity may depend on the deposition parameters so that the first thickness 222 is selected in conformity with deposition parameters so as to achieve the required final capacitive coupling of the capacitor to be formed in and over the first semiconductor region 220. In addition, the first thickness 222 is selected to conform with the desired resistance against leakage current so that, commonly, an optimum value is determined to provide for a given dielectric material exhibiting a specified permittivity, a high capacitance per unit area while maintaining the leakage current beyond a specified threshold. In one illustrative embodiment, where zirconium oxide is selected as the material for the first dielectric layer 221, the thickness 222 may range from approximately 3–15 nm.

A typical process flow for forming the semiconductor device 200 as depicted in FIG. 2a may include well-known photolithography and etch techniques for forming the isolation structures 202 and well-known and well-established deposition methods for forming the first dielectric layer 221. Accordingly, a detailed description of these process steps is omitted.

Figure 2B:
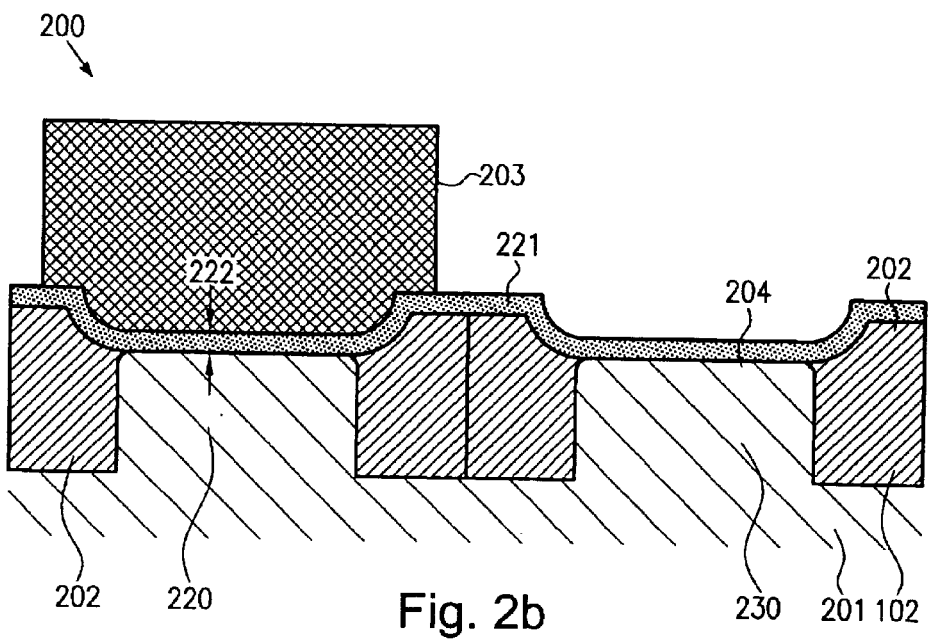

FIG. 2b schematically shows the semiconductor device 200 with a resist mask 203 formed over the first semiconductor region 220 and partially over the corresponding isolation structure 202. The resist mask 203 is to cover both areas of the first semiconductor regions 220 and the isolation structures 202, which will be used for forming a capacitive element, such as a de-coupling capacitor and the like. The formation of the resist mask 203 involves well known photolithography techniques, which for the sake of simplicity are not described in detail herein. Subsequently, the first dielectric layer 221 is patterned by subjecting the substrate 201 to a selective etch process, which may be performed as an isotropic or an anisotropic etch process.

Figure 2C:
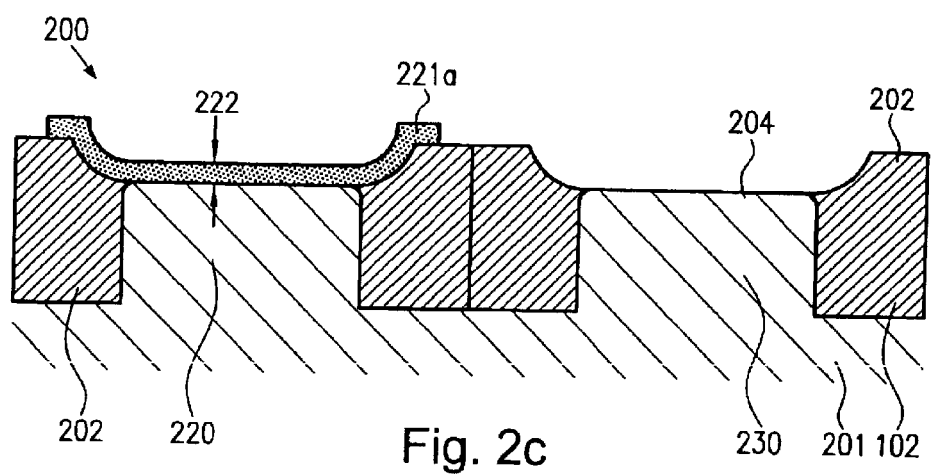

FIG. 2c schematically shows the semiconductor device 200 after patterning the first dielectric layer 221 to form a capacitor dielectric 221a and after removing the photoresist mask 203. Subsequently, the substrate 201 is cleaned to remove any residuals from the previous process steps, thereby preparing the second semiconductor region 230 to receive a dielectric layer that will serve as a gate insulation layer for a field effect transistor to be formed.

Figure 2D:
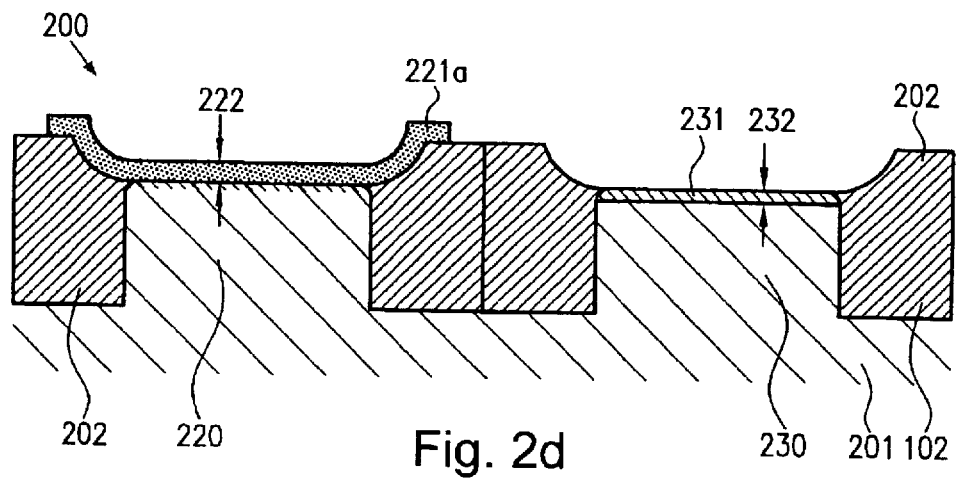

FIG. 2d schematically depicts the semiconductor device 200 with a second dielectric layer 231 having a thickness 232, which is formed on the second semiconductor region 230. The second dielectric layer 231 exhibits characteristics that comply with the specifications for a gate insulation layer of the highly sophisticated field effect transistor. For instance, the second dielectric layer 231 may be comprised of silicon dioxide or silicon oxynitride with the thickness 232 selected to ensure a sufficient capacitive coupling of a gate electrode to be formed to the underlying second semiconductor region 230. For example, the second thickness 232 may be selected in the range of approximately 1–5 nm, depending on the design requirements for the field effect transistor to be formed.

In one embodiment (not shown), a thin barrier layer may be formed on the capacitor dielectric 221a prior to the formation of the second dielectric layer 231. For example, a thin silicon nitride layer may be deposited on the semiconductor device 200 and may then be selectively removed from the second semiconductor region 230 prior to the formation of the second dielectric layer 231. In a further embodiment, a thin silicon nitride layer or any other appropriate barrier layer may be provided prior to the formation of the first dielectric layer 221 (FIG. 2a) so that, in combination with an additional barrier layer covering the surface portions of the capacitor dielectric 221a, the high-k dielectric may be substantially completely enclosed by a thin barrier layer. Process techniques for precisely depositing silicon nitride, for example, are well established in the art and may be advantageously used for "wrapping" or covering the capacitor dielectric 221a.

Regarding the formation of the second dielectric layer 231, any appropriate process may be employed, including advanced furnace processes, such as conventional oxidation or rapid thermal oxidation. For highly sophisticated semiconductor devices requiring ultra thin gate insulation layers on the order of 2–3 nm, alternative oxide and oxynitride deposition schemes may be employed for providing the required second thickness 232. Advantageously, when the capacitor dielectric 221a is covered or substantially completely enclosed by a thin barrier layer, "cross contamination" between the first and the second semiconductor regions 220, 230 may be substantially avoided, irrespective of the process used for forming the second dielectric layer 231.

Figure 2E:
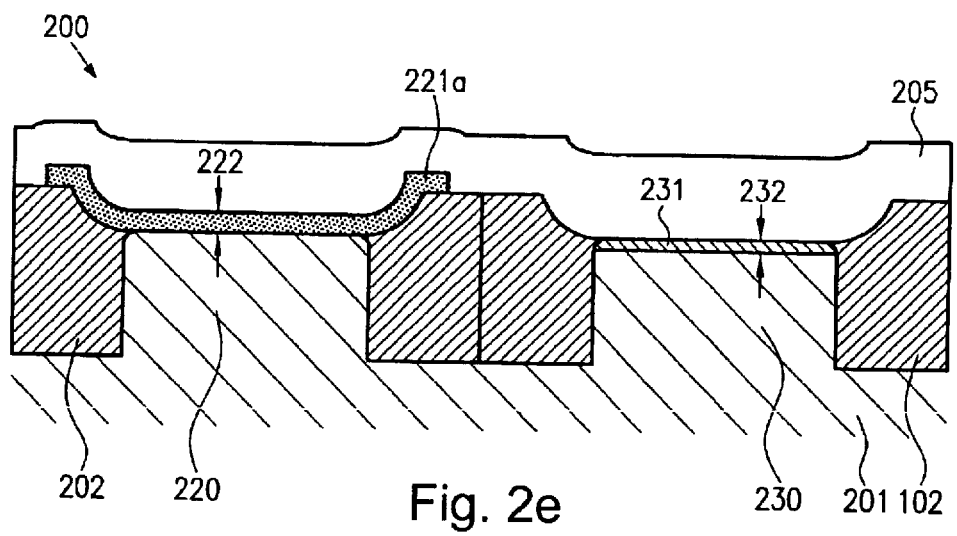

FIG. 2e schematically shows the semiconductor device 200 with a layer 205 of gate electrode material deposited over the substrate 201. In one typical embodiment, the layer 205 may be substantially comprised of polysilicon. In other embodiments, any other suitable materials, such as metal silicide or a metal, may be used. Subsequently, the layer 205 is patterned by well-established photolithography and etching techniques so that the corresponding process steps will not be described herein.

Figure 1C:
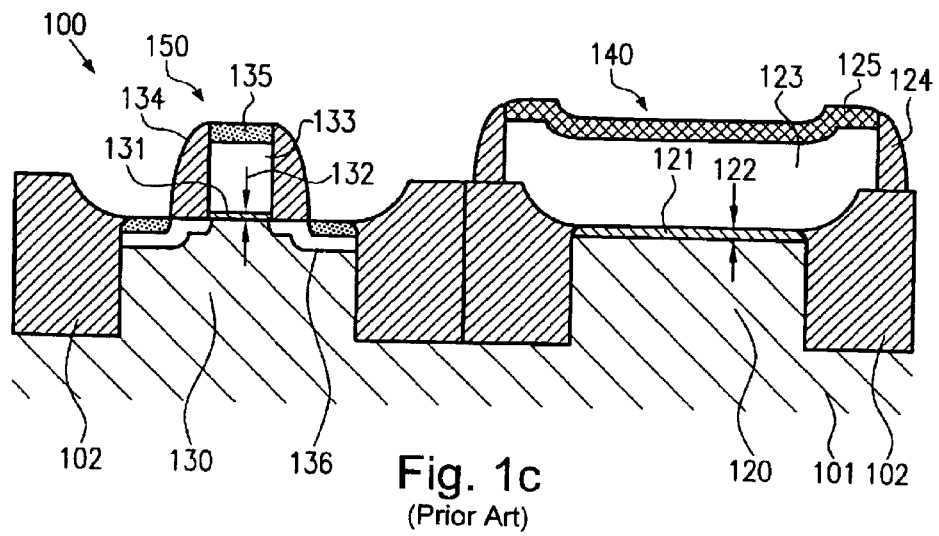
Figure 2F:
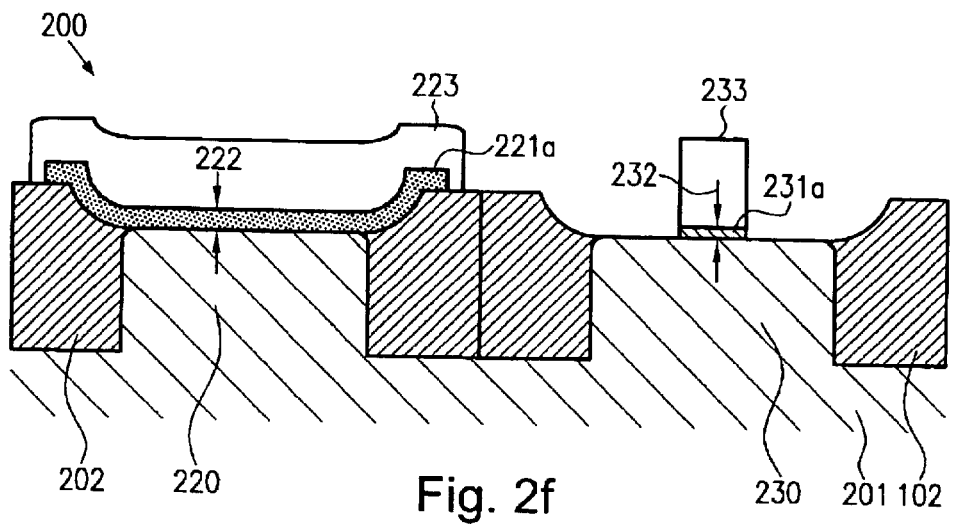

FIG. 2f shows the semiconductor device 200 after patterning the layer 205 to obtain a gate electrode 233 formed on the patterned second dielectric layer 231, which is indicated as 231a and which will be referred to as the gate insulation layer. Over the capacitor dielectric 221a and partially on the respective isolation structures 202, the layer 205 has been patterned into a capacitor electrode 223. Subsequently, the conventional process flow for completing a field effect transistor may be carried out as is, for example, described with reference to FIG. 1c.

Figure 2G:
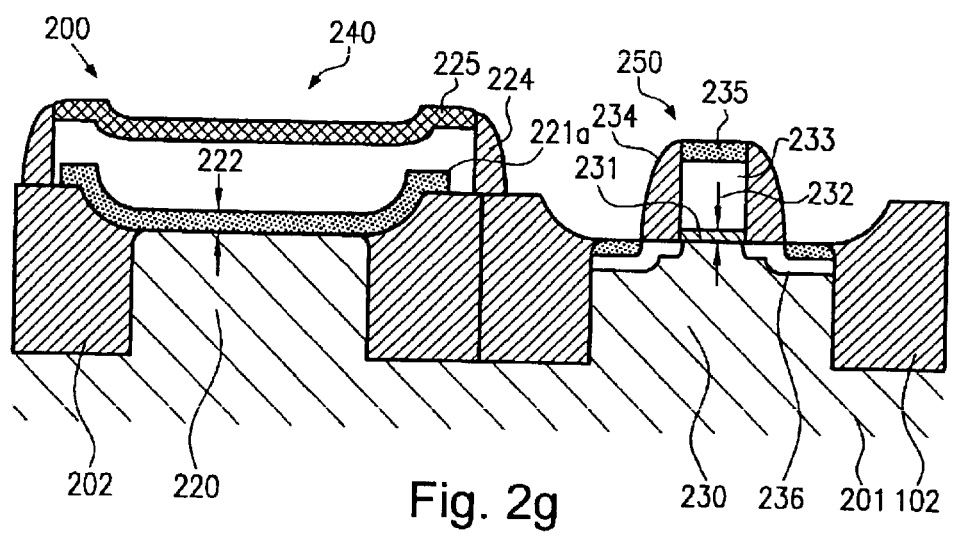

FIG. 2g shows the resulting semiconductor device 200 after conventional spacer, implant and self-aligned suicide processing to obtain a transistor element 250 and a capacitor 240. The transistor element 250 comprises metal silicide portions 235 formed in the upper portions of the gate electrode 233 and of drain and source regions 236. Moreover, sidewall spacers 234 are formed adjacent to sidewalls of the gate electrode 233. Similarly, the capacitor 240 comprises sidewall spacers 224 and a metal silicide portion 225. It should be noted that contact portions, such as the metal silicide portions 235 located on the drain and source regions 236, for the capacitor 240 are not depicted in the cross-sectional views of FIGS. 2f and 2g, since these contact portions are located at a different position with respect to a direction perpendicular to the drawing plane of FIGS. 2a–2g.

As a result, the embodiments described above provide a semiconductor device including capacitive elements, such as the combination of the gate electrode 233, the gate insulation layer 231a and the underlying active region 230, and the capacitor 240 formed by the capacitor electrode 223, the capacitor dielectric 221a and the underlying first semiconductor region 220, wherein the capacitive elements both exhibit a required high capacitance per unit area. While the gate insulation layer 231a is optimized to provide for a high capacitive coupling of the gate electrode 233 to the second active region 230 for sufficient channel control without unduly affecting the carry mobility at the interface between the gate insulation layer 231a and the active region 230, the capacitive coupling between the capacitor electrode 223 and the first semiconductor region 220 is optimized by introducing a high-k material, wherein the first thickness 222 is selected to provide for a required low leakage current. Consequently, capacitors of high capacitance with reduced leakage current may be provided in combination with highly sophisticated transistor elements requiring ultra thin gate insulation layers for sufficient carrier mobility on the same chip area, while reliability of the capacitor dielectric is ensured due to the omission of any destructive implantation steps, as for example required in the prior art processing, and due to the relatively large thickness 222. Moreover, as is evident from FIGS. 2a–2g, any appropriate technique may be used for forming the ultra thin gate insulation layer 231a so that sophisticated deposition and patterning processes may be employed instead of a high temperature oxidation. Moreover, since the capacitance per unit area of the capacitor 240 is significantly increased compared to prior art devices while, at the same time, leakage current is decreased and thus power consumption of the semiconductor device is decreased, the overall area of the chip required for providing a desired functionality may be reduced. Since less heat is created per unit area, integrated circuits including semiconductor devices in accordance with the present invention also significantly relax the issue of sufficient device cooling, thereby allowing the installation of less cool capacity, which also contributes to a significant reduction of power consumption, especially in portable devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:

providing a substrate having formed thereon a first semiconductor region and a second semiconductor region separated by an isolation structure;

depositing a single first dielectric layer having a first permittivity with a first thickness on a surface of said first semiconductor region;

forming a cap layer on exposed portions of said single first dielectric layer;

masking at least said first semiconductor region and removing an unmasked portion of at least said single first dielectric layer;

after forming said cap layer, forming a single second dielectric layer having a second permittivity with a second thickness on a surface of said second semiconductor region; and patterning a layer of conductive material formed above said first and said second dielectric layers to create a first capacitive element and a second capacitive element, wherein said first permittivity is higher than said second permittivity.

2. The method of claim 1, wherein said second thickness is less than said first thickness.

3. The method of claim 1, wherein removing an unmasked portion of at least said single first dielectric layer includes one of selectively anisotropically and selectively isotropically etching said unmasked portion of at least said single first dielectric layer.

4. The method of claim 1, wherein forming said single second dielectric layer includes at least one of oxidizing said substrate, rapidly thermally oxidizing said substrate and depositing said second single dielectric layer.

5. A method of fabricating a semiconductor device including a field effect transistor element and a passive capacitor, the method comprising:

defining a first active region and a second active region by forming an isolation structure;

forming a single first dielectric layer on a surface of said first active region to serve as a capacitor dielectric; and forming a single second dielectric layer on a surface of said second active region serving as a gate insulation layer of said field effect transistor;

wherein a permittivity of said single first dielectric layer is higher than that of said single second dielectric layer.

6. The method of claim 5, wherein a thickness of said single second dielectric layer is less than a thickness of said single first dielectric layer.

7. The method of claim 5, wherein fanning said single first dielectric layer includes depositing a material having said first permittivity, masking at least said first semiconductor region and removing an unmasked portion of said material.

8. The method of claim 7, wherein removing an unmasked portion of said material includes one of selectively anisotropically and selectively isotropically etching said unmasked portion of said material.

9. The method of claim 5, further comprising forming a cap layer on exposed portions of said single first dielectric layer prior to forming said single second dielectric layer.

10. The method of claim 5, wherein forming said single second dielectric layer includes at least one of oxidizing said substrate, rapidly thermally oxidizing said substrate and depositing said single second dielectric layer.

\* \* \* \* \*

UNITED STATES PATENT AND TRADEMARK OFFICE
CERTIFICATE OF CORRECTION

PATENT NO.    : 6,821,840 B2
DATED         : November 23, 2004
INVENTOR(S)   : Karsten Wiecozrek, Gerd Burbach and Thomas Feudel It is certified that error appears in the above-identified patent and that said Letters Patent is hereby corrected as shown below:

Column 10,
Line 9, "fanning" should be -- forming --.

Signed and Sealed this

First Day of February, 2005

JON W. DUDAS
*Director of the United States Patent and Trademark Office*